United States Patent [19]

Nelson et al.

[11] Patent Number: 5,177,587
[45] Date of Patent: Jan. 5, 1993

[54] PUSH-BACK JUNCTION ISOLATION SEMICONDUCTOR STRUCTURE AND METHOD

[75] Inventors: Carl Nelson, San Jose; Jia-Tarng Wang, Cupertino, both of Calif.

[73] Assignee: Linear Technology Corporation, Milpitas, Calif.

[21] Appl. No.: 845,341

[22] Filed: Mar. 4, 1992

Related U.S. Application Data

[63] Continuation of Ser. No. 666,504, Mar. 6, 1991, abandoned, which is a continuation of Ser. No. 384,160, Jul. 21, 1989, abandoned.

[51] Int. Cl.$^5$ .................... H01L 27/04; H01L 27/02
[52] U.S. Cl. .................................. 257/548; 257/550
[58] Field of Search ................. 357/48, 13, 34, 46, 357/43, 47

[56] References Cited

U.S. PATENT DOCUMENTS

| | | | |
|---|---|---|---|
| 3,753,803 | 8/1973 | Nomura et al. | 148/175 |
| 3,832,246 | 8/1974 | Lynch | 357/13 |
| 4,571,275 | 2/1986 | Moksvold | 148/175 |

FOREIGN PATENT DOCUMENTS 2348262 4/1974 Fed. Rep. of Germany ........ 357/48

*Primary Examiner*—Jerome Jackson, Jr.
*Assistant Examiner*—D. Monin
*Attorney, Agent, or Firm*—Flehr, Hohbach, Test, Albritton & Herbert

[57] ABSTRACT

The surface area of a junction-isolated tub in a silicon epitaxial layer grown on a silicon substrate is increased by introducing dopant into surface portions of the tub to effectively push back the junction between the tub and the isolation region. The junction-isolation region surrounding the tub typically has a dopant concentration profile which decreases from the center of the junction-isolation region towards the junction with the tub. By increasing the surface concentration of dopant in the tub, the net dopant concentration of peripheral portions of the junction-isolation region is converted, thereby effectively increasing the size of the surface of the tub. The dopant concentration in the surface of the entire tub can be increased, or only the periphery of the tub can have increased dopant concentration, thereby maintaining the breakdown voltage of devices fabricated in the tub.

3 Claims, 2 Drawing Sheets

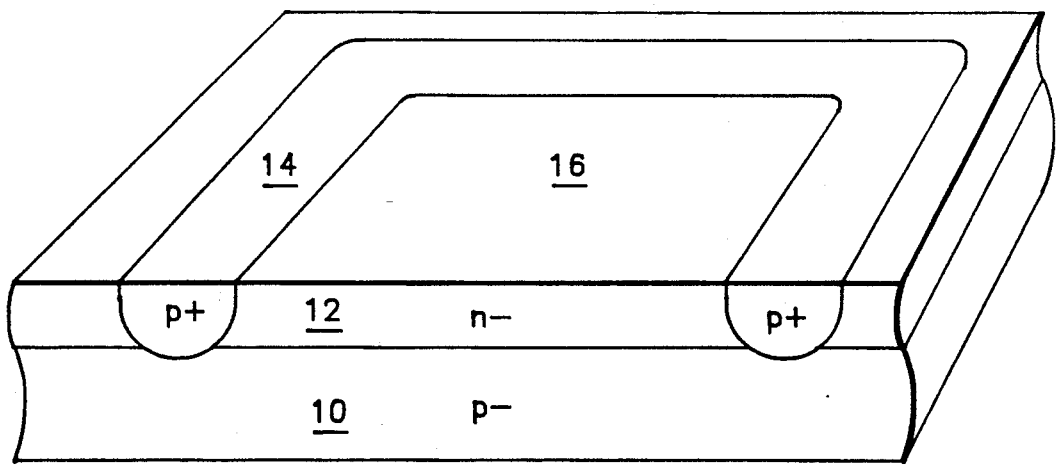
(PRIOR ART)
FIG.—1
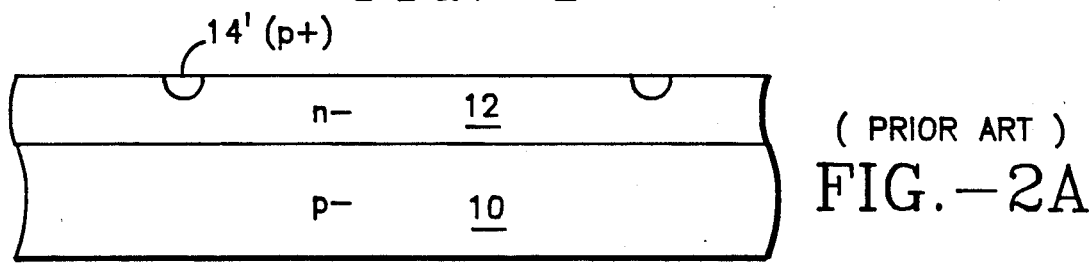
(PRIOR ART)
FIG.—2A
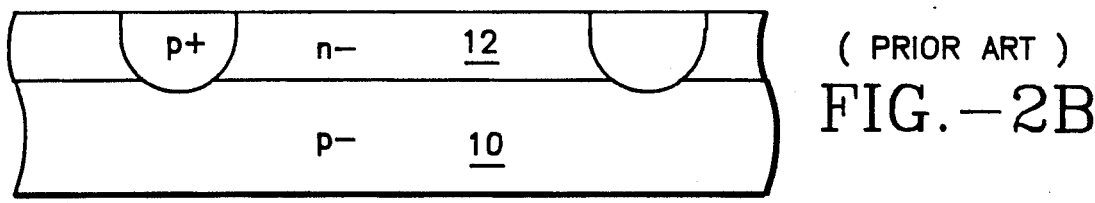
(PRIOR ART)
FIG.—2B
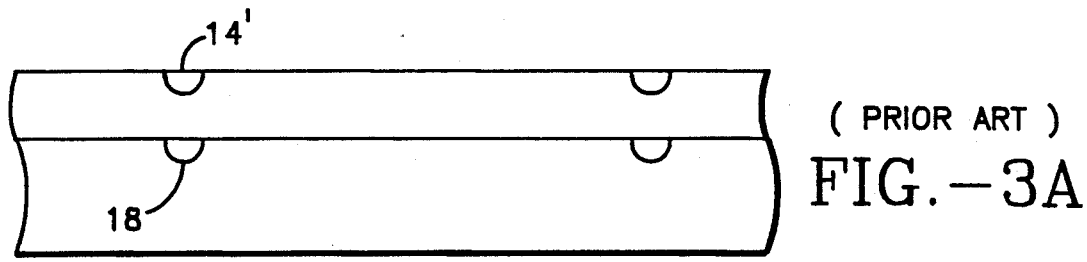
(PRIOR ART)
FIG.—3A
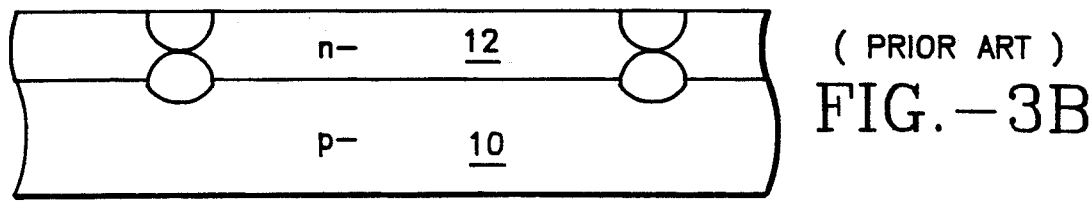
(PRIOR ART)
FIG.—3B

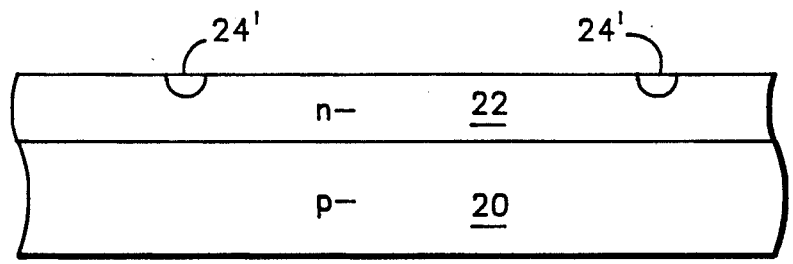
FIG.—4A
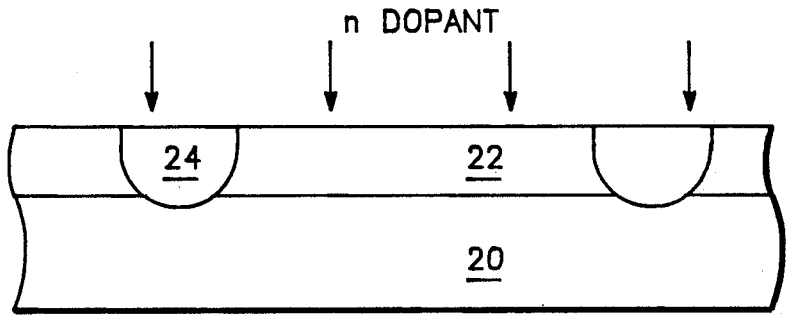
FIG.—4B
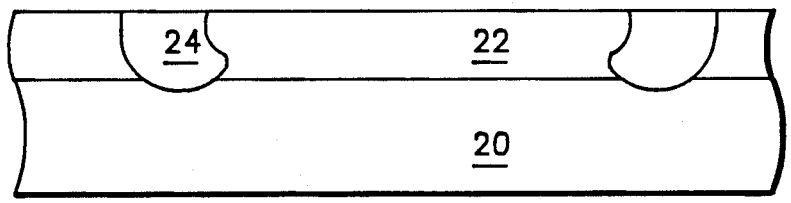
FIG.—4C
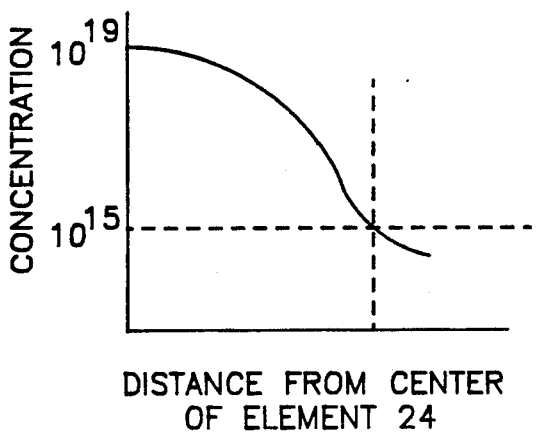
FIG.—5A
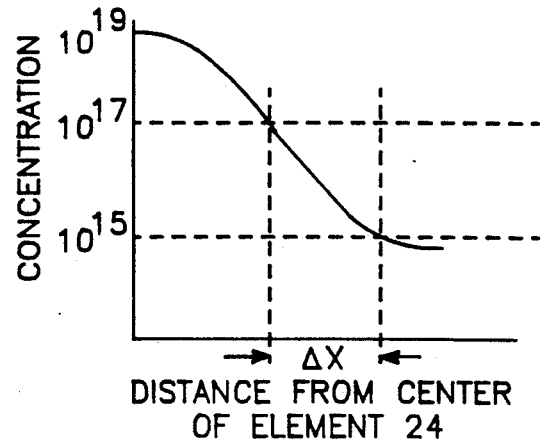
FIG.—5B

PUSH-BACK JUNCTION ISOLATION SEMICONDUCTOR STRUCTURE AND METHOD

This is a continuation of application Ser. No. 07/666,504, filed on Mar. 6, 1991, which is a continuation of Ser. No. 07/384,160, filed Jul. 21, 1989, both now abandoned.

BACKGROUND OF THE INVENTION

This invention relates generally to semiconductor technology, and more particularly, the invention relates to junction-isolated bipolar transistor structures fabricated in silicon semiconductor material.

Bipolar transistor devices and circuits are often fabricated in junction-isolated tubs in a silicon wafer to provide electrical isolation between circuit components, particularly in linear integrated circuits. Typically, an epitaxial layer of one conductivity type is grown on a silicon substrate of opposite conductivity type. The device tub is then defined in the epitaxial layer by forming a doped barrier of opposite conductivity type around the tub and extending from the surface of the epitaxial layer to the substrate. The doped barrier is formed by doping a shallow region in the epitaxial layer surface and then diffusing the dopants to the underlying substrate by thermal drive-in. The thermal drive-in also diffuses the dopants laterally so that the barrier assumes a generally semicircular cross section. This unwanted lateral diffusion reduces the available surface area for the integrated circuit components fabricated in the individual isolated tubs.

Heretofore, an attempt has been made to reduce the cross section of the barrier region by forming a highly doped region in the substrate prior to the epitaxial layer growth, and thereafter up-diffusing dopant from the substrate while dopant is down-diffused from the surface of the epitaxial layer. Accordingly, the dopant need diffuse only half the thickness of the epitaxial layer and, consequently, the lateral diffusion is also reduced, resulting in a larger tub surface. A problem with this approach is the alignment of the two doped regions so that the up-diffusion and the down-diffusion of dopants will meet.

SUMMARY OF THE INVENTION

Accordingly, an object of the invention is an improved method of forming junction-isolated tubs in semiconductor device fabrication.

Another object of the invention is a junction-isolated semiconductor structure formed in a tub having greater surface area.

A feature of the invention is the provision of a dopant profile in the junction-isolated tub whereby the isolation junction is laterally displaced to increase the tub surface area.

In one embodiment of the invention, after the junction-isolation region of one conductivity type is formed around a tub of opposite conductivity type in a surface of a semiconductor body, dopant of the opposite conductivity type is introduced into the tub surface, such as by diffusion or implantation. The opposite conductivity type dopant has a concentration exceeding the dopant concentration of the peripheral portion of the junction isolation region and converts the peripheral portion to opposite conductivity type.

In an alternative embodiment, the opposite conductivity type dopant can be introduced in the surface of the tub prior to the formation of the junction-isolation region.

The opposite conductivity type dopant can be introduced across the entire surface of the semiconductor body, or the dopant can be introduced into selected tubs only. Since the dopant can lower the breakdown voltage of devices fabricated in the tubs, the latter approach is preferable if high breakdown voltage devices are required in specific isolation tubs in the integrated circuit.

Alternatively, the dopant can be introduced in a ring around the periphery of a tub and overlapping the junction-isolation region so that the breakdown voltage of devices fabricated in the interior part of the tub will not be affected.

In another alternative embodiment, the dopant concentration of the epitaxial layer can be increased as the layer is grown on the substrate to thereby achieve the higher dopant concentration at the surface of the epitaxial layer and thus reduce the width of the junction-isolation region.

The invention, and objects and features thereof, will be more readily apparent in the following detailed description and appended claims when taken with the drawing.

BRIEF DESCRIPTION OF THE DRAWING

FIG. 1 is a perspective view in section of a portion of a semiconductor structure illustrating the junction-isolation of a device tub.

FIGS. 2(a) and 2(b) are section views illustrating the formation of a junction-isolation region in accordance with the prior art.

FIGS. 3(a) and 3(b) are section views of a semiconductor structure showing an alternative method of forming a junction-isolation region in accordance with the prior art.

FIGS. 4(a)–4(c) are section views illustrating the fabrication of a junction-isolation region in accordance with one embodiment of the invention.

FIGS. 5(a) and 5(b) are graphs illustrating dopant concentration of a junction-isolation region and an epitaxial layer in accordance with the prior art and in accordance with the invention, respectively.

DETAILED DESCRIPTION OF ILLUSTRATIVE EMBODIMENT

Referring now to the drawing, FIG. 1 is a perspective view in section of a junction-isolated tub in a semiconductor device in accordance with prior art. The structure includes a p− doped silicon substrate 10 on which an n− doped epitaxial layer 12 has been grown. A p+ junction-isolation region 14 surrounds a device region on tub 16 in which a circuit structure can be fabricated which is electrically isolated from other circuit structures formed in the semiconductor body. As illustrated, the junction-isolation region 14 has a generally semicircular cross-sectional area which extends from the surface of the epitaxial layer 12 to the underlying p− substrate 10.

FIGS. 2(a) and 2(b) are section views illustrating the formation of the junction-isolation region 14, in accordance with prior art fabrication techniques. After the epitaxial layer 12 is grown on the substrate 10, a small ring 14' of p+ dopant, such as boron at a concentration of $10^{19}$ atoms per cubic centimeter, is formed in the surface of the epitaxial layer 12. Thereafter, the boron dopant is thermally driven into the epitaxial layer and to the underlying boron-doped substrate 10, as illustrated in FIG. 2(b). As noted above, the boron atoms diffuse laterally as well as vertically, thereby resulting in a generally semicircular cross section for the junction-isolation region. The boron dopant concentration in the ring will vary from a higher concentration in the central portion to a lower dopant concentration at the peripheral portion, as will be described further hereinbelow, with reference to FIGS. 5(a) and 5(b).

Due to the lateral diffusion of the boron dopant in the diffusion ring, the surface area of the tub 16 is reduced, thereby limiting the surface area for the fabrication of circuit components and structures. Heretofore, one attempt at reducing the width of the junction-isolation region has been to form a p+ doped region in the substrate 10 prior to the epitaxial growth of layer 12, and then forming the highly doped region 14' above the highly doped region in the substrate, as illustrated in the cross-sectional view of FIG. 3(a). Thereafter, the p+ dopant atoms are both up-diffused and down-diffused by thermal drive-in so that the dopants only travel approximately one-half the thickness of the epitaxial layer 12. Consequently, the lateral or horizontal diffusion of the dopants is limited and the width of the junction-isolation region is thereby reduced. However, this technique requires accurate alignment of the doped region 14' over the doped region 18 in the substrate, so that the doped regions diffuse into each other.

FIGS. 4(a)–4(c) are section views illustrating the fabrication of a junction-isolation region in accordance with one embodiment of the present invention. In FIG. 4(a), a p− substrate 20 has an n− epitaxial layer 22 formed thereon with a highly doped p+ ring 24' formed in the surface of the epitaxial layer, similar to the prior art of FIG. 2(a).

Thereafter, as illustrated in FIG. 4(b), a diffusion or implantation of n-type dopant is made into the surface of the epitaxial layer 22. The structure is then heated to activate the implant and also to drive-in the p+ dopant from ring 24' to form the junction-isolation region 24. The concentration of the n-type dopant exceeds the concentration of the p-type dopant in the peripheral portion of the junction-isolation region 24, and thereby converts the peripheral portion to an effective n-type dopant concentration, as illustrated in FIG. 4(c). In effect, the junction-isolation region is pushed back at the surface of the epitaxial layer, thereby increasing the surface area of the tub in which a circuit structure is fabricated.

The dopant concentration profile of the junction-isolation region 24 in the epitaxial layer 22 is illustrated in FIG. 5(a). In this illustrative embodiment, the maximum p-type dopant concentration in the junction-isolation region is $10^{19}$ atoms per cubic centimeter and extends to $10^{15}$ atoms per cubic centimeter at the periphery of the junction-isolation region, assuming that the dopant concentration of the epitaxial layer is also $10^{15}$ atoms per cubic centimeter. As illustrated in FIG. 5(b), by introducing n-type dopant of $10^{17}$ atoms per cubic centimeter into the surface of the epitaxial layer, the junction-isolation region is effectively pushed back a distance, $\Delta x$, as illustrated.

As noted above, the introduction of the n-type dopant into the surface of the epitaxial layer can reduce the breakdown voltage of devices fabricated in the tub. Accordingly, if high voltage breakdown devices are required in certain areas of the integrated circuit, the n-type dopant will be introduced into only selected tubs. Alternatively, the n-type dopant can be introduced in a ring around the periphery of a tub and overlapping the junction-isolation region, whereby the breakdown voltage of devices in the interior of the tub are not affected.

To further increase the surface area of the tub, the invention can be used with an up-diffusion and down-diffusion process, as illustrated in FIGS. 3(a) and 3(b). Further, the surface dopant can be introduced prior to the fabrication of the junction-isolation region rather than after the formation of the junction-isolation region, as illustrated in FIG. 4(b). In yet another embodiment, the dopant concentration of the epitaxial layer can be varied as the epitaxial layer is grown on the substrate to thereby effect a dopant concentration gradient that increases at the surface of the epitaxial layer.

The invention provides a simple process for increasing the surface of a junction-isolated tub and has particular applicability in fabricating bipolar devices in silicon semiconductor structures. While the illustrative embodiment of FIGS. 4(a)–4(c) has a p− substrate and an n− epitaxial layer, the invention is equally applicable to a semiconductor structure having an n− substrate and a p− epitaxial layer. An additional advantage in doping the surface of the epitaxial layer is the raising of the inversion voltage by increasing the surface dopant concentration.

Thus, while the invention has been described with reference to one embodiment of the invention, the description is illustrative of the invention and is not to be construed as limiting the invention. Various modifications and applications may occur to those skilled in the art without departing from the true spirit and scope of the invention as defined by the impending claims.

We claim:

1. A junction-isolated tub for use in fabricating circuit components in a silicon integrated circuit comprising a silicon substrate of one conductivity type, an epitaxial silicon layer of opposite conductivity type grown on a surface of said silicon substrate, a diffused isolation region of said one conductivity type extending from a surface of said epitaxial layer to said substrate, said isolation region surrounding a region of said epitaxial layer and forming an electrical junction therewith to form an isolated region of opposite conductivity type, said diffused isolation region having a concentration gradient of dopant of said one conductivity type which decreases from the center of the diffused isolation region outwardly toward its edge, said region of said isolated region of said epitaxial layer having a surface concentration of said dopant of opposite conductivity type at said junction with the isolation region which is higher than the dopant concentration in the underlying epitaxial layer and higher than the dopant concentration near the edge portion of said isolation region to thereby compensate the dopant concentration near the edge portion of said isolation region to convert said edge portion to said opposite conductivity type, and thereby providing an increased area of said region of said opposite conductivity type isolated by said isolation region.

2. The junction-isolated tub as defined in claim 1 wherein said surface concentration of said dopant of opposite conductivity type extends across the entire surface of said region of said epitaxial layer.

3. The junction-isolated tub as defined in claim 1 wherein said surface concentration of said dopant of opposite conductivity type which is higher than the dopant concentration in the underlying epitaxial layer is restricted to the periphery of said isolated region of said epitaxial layer.

* * * * *